United States Patent

Soo et al.

(10) Patent No.: US 11,215,668 B2
(45) Date of Patent: Jan. 4, 2022

(54) PRECISION BATTERY ENERGY MEASURING SYSTEM

(71) Applicants: David Chee-Fai Soo, Fremont, CA (US); Mohammad Yunus, Tracy, CA (US)

(72) Inventors: David Chee-Fai Soo, Fremont, CA (US); Mohammad Yunus, Tracy, CA (US)

( * ) Notice: Subject to any disclaimer, the term of this patent is extended or adjusted under 35 U.S.C. 154(b) by 266 days.

(21) Appl. No.: 16/435,330

(22) Filed: Jun. 7, 2019

(65) Prior Publication Data

US 2019/0383879 A1 Dec. 19, 2019

Related U.S. Application Data

(60) Provisional application No. 62/685,638, filed on Jun. 15, 2018.

(51) Int. Cl.
*G01R 31/3828* (2019.01)
*G01R 31/3842* (2019.01)
*G01R 31/374* (2019.01)

(52) U.S. Cl.
CPC ....... *G01R 31/3828* (2019.01); *G01R 31/374* (2019.01); *G01R 31/3842* (2019.01)

(58) Field of Classification Search
CPC ............ G01R 31/3828; G01R 31/3842; G01R 31/374
See application file for complete search history.

(56) References Cited

U.S. PATENT DOCUMENTS

| 4,194,146 | A | * | 3/1980 | Patry | ..................... | H01M 10/44 320/136 |
| 5,627,453 | A | * | 5/1997 | Sheehan | ............ | G01R 31/3842 320/134 |
| 5,703,466 | A | * | 12/1997 | Honda | .................. | H02J 7/0077 320/152 |
| 5,841,284 | A | * | 11/1998 | Takahashi | .......... | G01R 31/3648 324/428 |
| 6,157,170 | A | * | 12/2000 | Noda | ................. | G01R 31/3648 320/132 |
| 6,639,407 | B1 | * | 10/2003 | Cheng | .................. | H02J 7/0047 320/132 |

(Continued)

*Primary Examiner* — Walter L Lindsay, Jr.
*Assistant Examiner* — Milton Gonzalez
(74) *Attorney, Agent, or Firm* — Ellenoff Grossman & Schole LLP; James M. Smedley; Alex Korona (57) ABSTRACT

Apparatus and associated methods relate to a system or method of precision battery charge measurement. Some embodiments may include precise charge and discharge control based on precision battery voltage and current sensing. In an illustrative example, energy either going in or out of the battery may be multiplied or computed using novel circuitry. In various embodiments, energy may be computed in a precision energy small unit determined as a percentage of total battery capacity. In an illustrative example, the precision unit may be, for example, 0.0018% of the total battery capacity. In some embodiments, the energy meter value may be in digital form, so it can be stored in memory and transmitted to external users as desired using USB type C or any other method. Various embodiments may advantageously provide extended battery life, based on using the measured energy meter value to maintain the state of charge of the battery.

20 Claims, 4 Drawing Sheets

(56) References Cited

U.S. PATENT DOCUMENTS

2006/0097699 A1\* 5/2006 Kamenoff ............ H02J 7/0048
320/132
2006/0197503 A1\* 9/2006 Arai .................. G01R 31/3842
320/132

\* cited by examiner

PRECISION BATTERY ENERGY MEASURING SYSTEM

CROSS REFERENCE TO RELATED APPLICATIONS

This application claims the benefit of U.S. Provisional Application No. 62/685,638, titled "PRECISION BATTERY ENERGY MEASURING SYSTEM," filed by Applicants: David Chee-Fai Soo and Mohammad Yunus, on Jun. 15, 2018.

This application incorporates the entire content of the above-referenced application herein by reference.

TECHNICAL FIELD

Various embodiments relate generally to measuring battery energy.

BACKGROUND

A battery is an energy storage element. An electric battery may store and deliver energy in the form of electric charge to a connected load. For example, an electric battery may be connected to a load such as, for example, a device requiring electric power to operate. In an illustrative example, the connected device may operate using electric energy delivered by the battery.

As electric energy is delivered by a battery to a connected load, the electric charge retained by the battery will decrease. Such decrease in battery electric charge may be referred to as battery discharge. In some scenarios, a battery may discharge to a charge level insufficient to operably power a particular device. Some batteries are rechargeable, based on replenishing the battery charge from an external energy source connected to the battery.

In an illustrative example, some battery powered devices may be operated for extended time periods, based on repeatedly recharging the battery powering the device. The performance of some types of battery, such as, for example, a lithium battery, may benefit from precision control and monitoring in various scenarios.

SUMMARY

Apparatus and associated methods relate to a system or method of precision battery charge measurement. Some embodiments may include precise charge and discharge control based on precision battery voltage and current sensing. In an illustrative example, energy either going in or out of the battery may be multiplied or computed using novel circuitry. In various embodiments, energy may be computed in a precision energy small unit determined as a percentage of total battery capacity. In an illustrative example, the precision unit may be, for example, 0.0018% of the total battery capacity. In some embodiments, the energy meter value may be in digital form, so it can be stored in memory and transmitted to external users as desired using USB type C or any other method. Various embodiments may advantageously provide extended battery life, based on using the measured energy meter value to maintain the state of charge of the battery.

Various embodiments may achieve one or more advantages. In some embodiments, battery life may be extended. This facilitation may be a result of monitoring key parameters of a battery during charging and discharging of the battery. Various designs may improve the precision of battery charge or discharge control. Such improved battery charge and discharge control precision may be a result of sensing energy either going in or out of the battery in a precision energy small unit. In some examples, the precision energy small unit may be determined as a percentage of the total battery capacity. Some implementations may improve a user's access to measured battery performance parameters. Such improved access to battery performance parameters may be a result of communicating digitized battery performance parameter measurements to external users via a communication means such as, for example, USB C. Some embodiments may improve multi-cell battery monitoring. Such improved multi-cell battery monitoring may be a result of configuring a battery monitoring system with novel circuitry adapted to monitor each cell of a multi-cell battery, permitting the monitoring system to provide access to battery performance parameters measured at a per-cell resolution. In an illustrative example, some battery monitoring systems may advantageously provide charge and discharge monitoring and control based on per-cell battery performance parameters. In some examples, such per-cell battery performance parameters may be measured from each cell of multi-cell batteries used in, for example, automotive or tool applications, which may include a battery having five, or even more, battery cells.

Some designs may improve the accuracy of battery charging and discharging analysis. Such improved charging and discharging analysis may be a result of a battery monitoring system or method storing measured battery charging and discharging characteristics and measured performance parameters in non-volatile memory (NVM). In an illustrative example, charging and discharging characteristics and measured performance parameters stored in NVM could be transferred to a battery manufacturer, improving the manufacturer's access to data useful to improve understanding battery performance and usage in real field environments. Some embodiments may improve access to battery performance parameter data. Such increased access to battery performance parameter data may be a result of storing performance parameters and charging and discharging characteristics in NVM, and transferring the performance parameters and data using a cell phone or similar method, such as, for example, USB, or WiFi. In some examples, performance parameters and charging and discharging characteristics may be logged in NVM, and transferred upon detection of an advantageous data transfer opportunity, such as when an embodiment battery monitoring system operating in a region without communications infrastructure moves within range of a cell tower or mobile device wireless data interface. Various implementations may improve battery charge and discharge rate control. This facilitation may be a result of configuring a battery monitoring system to sense the temperature of each battery cell individually and communicate each cell temperature to the controller, so that the battery charge and discharge may be adapted as a function of measured battery cell temperature. In some designs, detection of failing battery cells may be improved, for example, by advantageously detecting a failing battery cell earlier based on anomalous cell temperature. Such improved failing battery cell detection may be a result of sensing the temperature of each battery cell individually, so that battery cell condition may be determined based on comparing measured individual battery cell temperature to reference or theoretical battery cell temperatures.

Some embodiments may provide a self-monitoring battery energy measurement and control system. This facilitation may be a result of configuring precision battery energy measurement and control with a type C communication platform adapted to communicate measured battery performance parameters to a remote user or a monitoring and control service in a network cloud. Various implementations may improve reliability of battery energy measurement and monitoring. Such improved battery energy measurement and monitoring reliability may be a result of a battery energy measurement and monitoring system configured with a backup communication path. For example, some embodiments may be configured to communicate with a destination via a default path (CC pin), switching communication with a destination device to a backup path if an undesirable condition is detected in the default path.

In some exemplary scenarios, USB type C may be adopted as power delivery for battery charging systems, including systems having capacity up to 100 Watt, 2.7 to 20V. In an illustrative example, availability of USB type C power delivery systems opens opportunities to perform several precision monitoring functions in the battery itself while being used in the field. This accumulated data could be transferred, for example, through a cell phone or any computer system, to anyone interested in the long-term battery performance data, such as, for example, battery manufacturers, or researchers. In some examples, the monitored parameters may include battery voltage, battery charging and discharging current, measurement system of the energy stored during charging and energy delivered out of the battery during use, temperature of the battery, or temperature of one or more cell of a multi-cell battery. The present disclosure describes various embodiments, including an illustrative implementation of an exemplary battery charge measurement system function. In an illustrative example, such information may be useful to keep the state of charge, to extend life of the battery during a short or long duration pause in battery usage.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, illustrative precision energy measurement designs are briefly introduced with reference to FIGS. 1-2. Then, with reference to FIG. 3, an illustrative signal flow of an exemplary precision energy measuring system is disclosed.

Figure 1A:
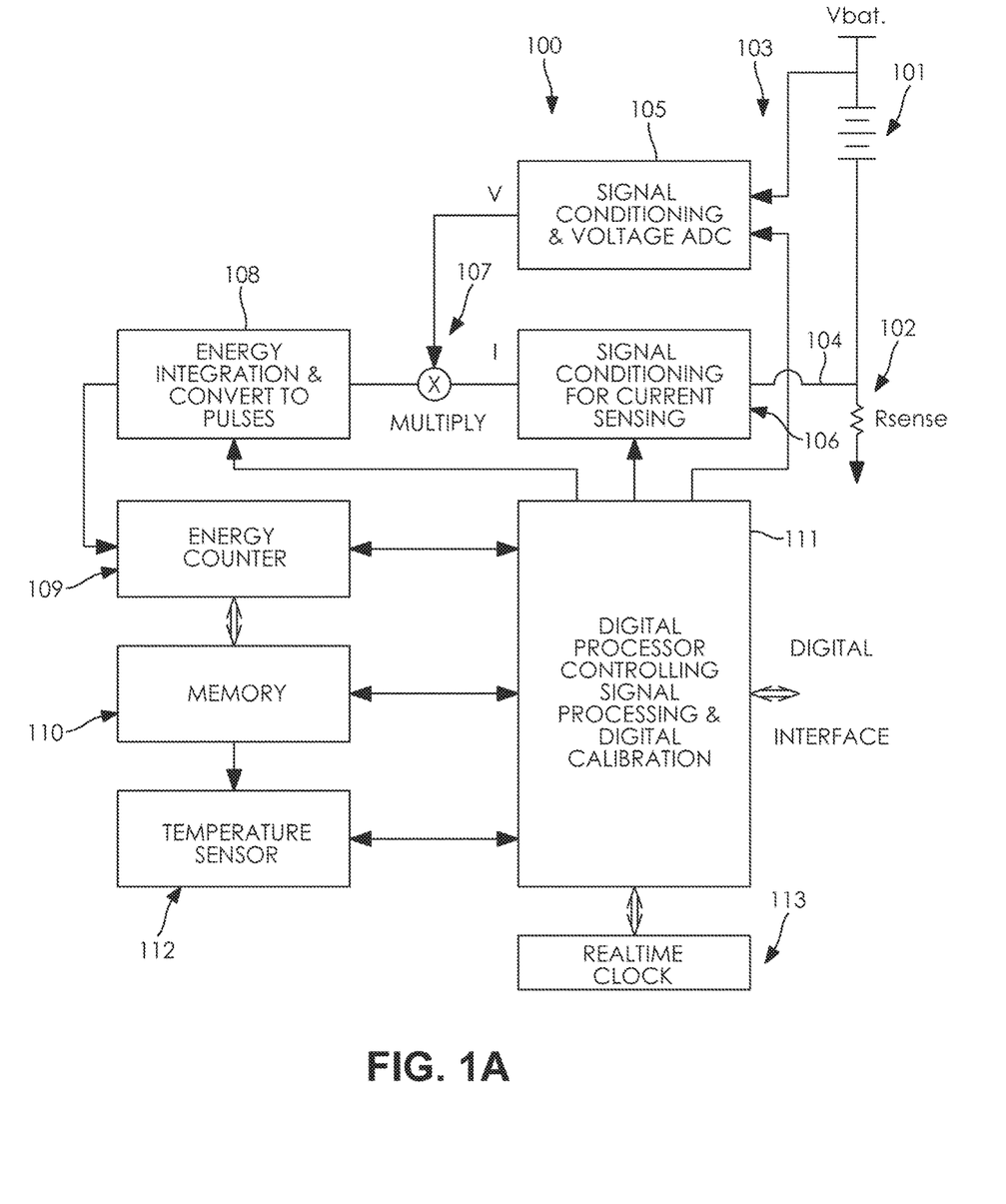
FIGS. 1A-1C depict various exemplary precision battery energy measuring system embodiments configured to compute metered energy going in or out of a battery.
Figure 1B:
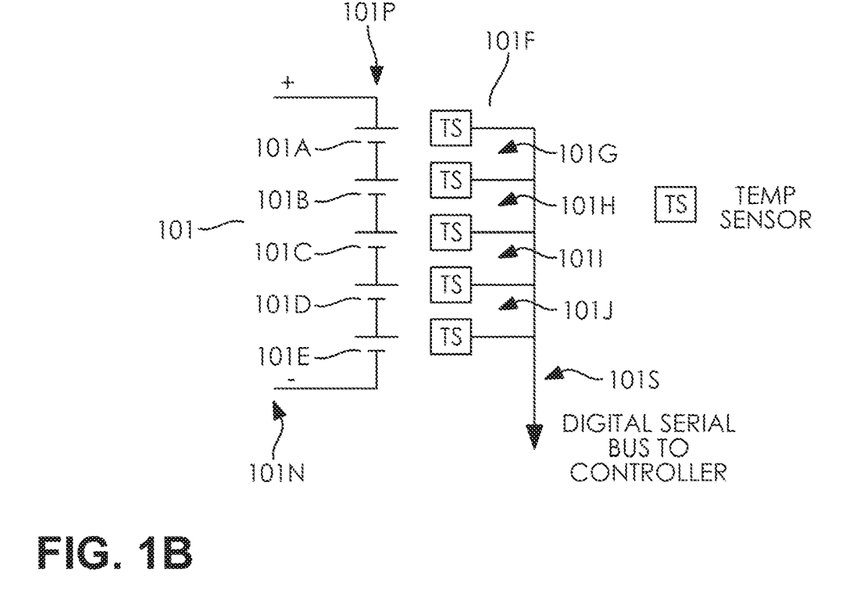
Figure 1C:
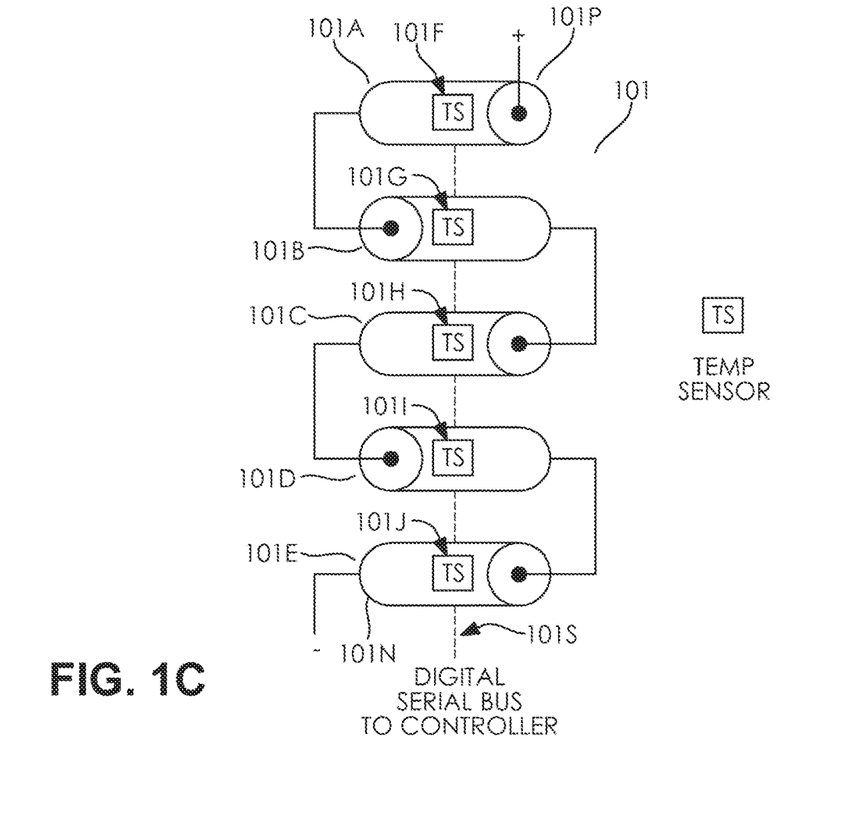

FIGS. 1A-1C depict various exemplary precision battery energy measuring system embodiments configured to compute metered energy going in or out of a battery.

In FIG. 1A, the block diagram of the exemplary embodiment precision battery energy measuring system 100 includes battery, voltage and current sensing and a block of novel circuitry that computes the metered energy going in or out of the battery 101 in digitized form. In the depicted embodiment, communication circuits and intelligence features optimize the measurement system during heavy or light loads of the battery. Thus, even a small leakage of the battery 101 could be computed. In the depicted embodiment, the battery 101 voltage is sensed at voltage signal conditioning input 103 and fed to the voltage signal conditioning circuit with ADC 105. In the depicted embodiment, the voltage signal conditioning circuit with ADC 105 digitizes the conditioned voltage signal to prepare the voltage signal to be multiplied with the depicted sensed current I. In the illustrated embodiment, the battery 101 current through the sense resistor Rsense 102 is sensed at current signal conditioning input 104. In some embodiments, the sense resistor Rsense 102 may be a precision sense resistor. In the depicted embodiment, the current sensed at current signal conditioning input 104 is fed to current signal conditioning circuit 106 to amplify and prepare the current signal to be multiplied by the multiplier 107 with the depicted digitized voltage V. In an illustrative example, the depicted digitized voltage V may be a pulse frequency modulated signal (PDF) as depicted, for example, in FIG. 2. In the illustrated embodiment, the multiplier 107 product of the depicted digitized voltage V and the depicted current I is fed to the precision energy integrator 108 that converts the energy to a series of pulses proportional to the energy in or out of the battery. Some embodiments may include another block (not shown in FIG. 1A) configured to monitor the sign of the current sense indicating energy going in or out of the battery 101. In an illustrative example, the signal monitoring the sign of the current sense indicating energy going in or out of the battery 101 could be fed to the energy integrator 108 to distinguish charging or discharging of the battery 101. In the depicted example, the pulses output by the energy integrator 108 to the energy counter 109 represent quantum of energy for high precision. Thus, quanta of the energy are computed by the energy counter 109 and the samples are saved in the memory 110 with time stamp and temperature data if needed. In an illustrative example, the memorized information could be further processed in some embodiments by the digital signal processor (DSP) 111 that can communicate with the outside world using any state of the art digital interface such as USB type C or even wireless communication. In the depicted embodiment, the block diagram includes the temperature sensor 112 and the real time clock circuitry 113 operably and communicatively coupled with the DSP 111 to enhance utility of the measured energy information. In the illustrated embodiment, the current sensing, voltage sensing, signal conditioning, signal processing, and calibration are controlled by the DSP 111. In the depicted embodiment, the DSP 111 includes a processor (CPU) with access to processor-executable program instructions configured to control the precision battery energy measuring system 100 current sensing, voltage sensing, signal conditioning, signal processing, and calibration functions. In the illustrated example, the precision battery energy measuring system 100 DSP 111 is operably and communicatively coupled with the depicted elements to facilitate current sensing, voltage sensing, signal conditioning, signal processing, and calibration operations controlled by the DSP 111. In some embodiments, the DSP 111 may govern various settings, or control functions other than, or in addition to, signal processing and calibration. In the depicted embodiment, the DSP 111 is operably and communicatively coupled with the depicted digital interface. In some embodiments, the DSP 111 digital interface may be USB type C, or any other digital interface. In various examples, the memory 110 may include a non-volatile memory (NVM). In some embodiments, the characteristics of the charging and discharging of the battery may be stored in the NVM. In an illustrative example, the characteristics of the charging and discharging of the battery stored in the NVM may be transferred, for example, to the battery manufacturer, to enable improved understanding of the battery performance in real field environments and usage. In various examples, such transfer of the characteristics of the charging and discharging of the battery stored in the NVM could be made using, for example, mobile device data, or similar methods such as with serial interfaces including USB or WiFi.

FIG. 1B depicts an exemplary battery precision energy measuring system sensor embodiment configured to monitor each cell of a multi-cell battery, permitting the monitoring system to provide access to battery performance parameters measured at a per-cell resolution. In FIG. 1B, the exemplary multi-cell battery 101 includes the battery cells 101A, 101B, 101C, 101D, 101E. In the depicted embodiment, the battery cells 101A, 101B, 101C, 101D, 101E are electrically connected in a series electrical configuration forming the multi-cell battery 101. In the illustrated embodiment, the battery cell 101A positive terminal is configured as the multi-cell battery 101 positive terminal 101P. In the depicted embodiment, the battery cell 101E negative terminal is configured as the multi-cell battery 101 negative terminal 101N. In the illustrated example, each multi-cell battery 101 cell 101A, 101B, 101C, 101D, 101E is individually configured with a temperature sensor adapted to permit an embodiment precision energy measuring system to monitor and control the battery charge and discharge as a function of individual battery cell temperature. In the depicted embodiment, the temperature sensors are configured to transduce the individual battery cell temperatures to digital form and communicate the individual digitized battery cell temperatures to a controller via the digital serial bus 101S. In the illustrated embodiment, the temperature sensor 101F is configured to sense the battery cell 101A temperature. In the depicted embodiment, the temperature sensor 101G is configured to sense the battery cell 101B temperature. In the illustrated embodiment, the temperature sensor 101H is configured to sense the battery cell 101C temperature. In the depicted embodiment, the temperature sensor 101I is configured to sense the battery cell 101D temperature. In the illustrated embodiment, the temperature sensor 101J is configured to sense the battery cell 101E temperature. In some examples, the controller receiving the digitized battery cell temperatures via the digital serial bus may be, for example, the DSP 111 configured in the precision battery energy measuring system 100, depicted in FIG. 1A. In various designs, the controller receiving the digitized battery cell temperatures via the digital serial bus may be the digital signal processor and controller 211 configured in the precision battery energy measuring system 200, depicted in FIG. 2.

FIG. 1C depicts an exemplary alternative view of the exemplary battery precision energy measuring system sensor embodiment illustrated by FIG. 1B. In FIG. 1C, the illustrated embodiment includes the multi-cell battery 101 cells 101A, 101B, 101C, 101D, 101E respectively configured with the temperature sensors 101F, 101G, 101H, 101I, 101J. In the illustrated example, the temperature sensors 101F, 101G, 101H, 101I, 101J are operably and communicatively coupled with the digital serial bus 101S to communicate the individual digitized battery cell temperatures to a controller.

Figure 2:
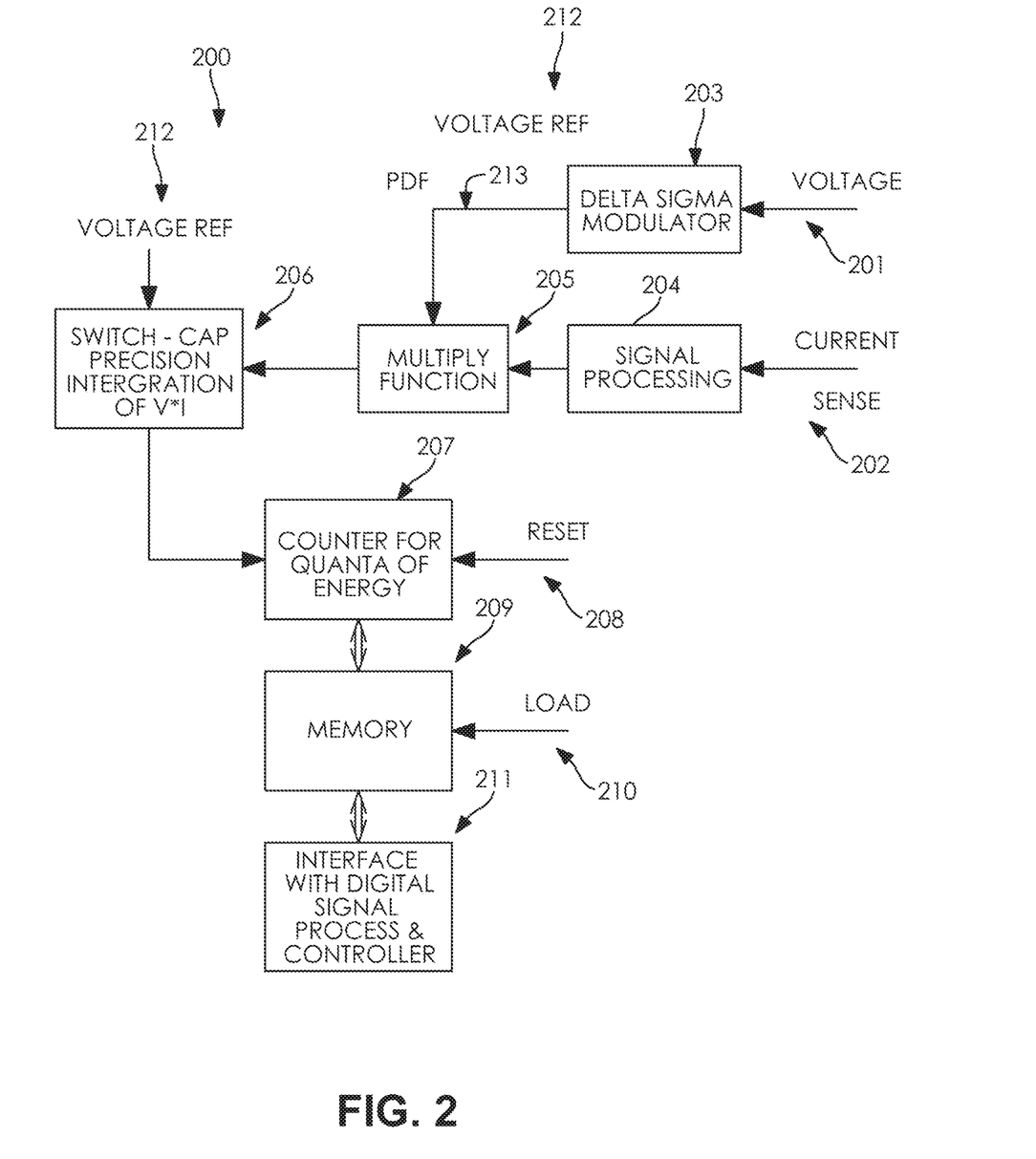
FIG. 2 depicts additional details of the exemplary precision battery energy measuring system configured to compute metered energy going in or out of a battery, depicted in FIG. 1A.

FIG. 2 depicts additional details of the exemplary precision battery energy measuring system configured to compute metered energy going in or out of a battery, depicted in FIG. 1A. FIG. 2 illustrates further detail of the precision battery energy measuring system 100 (depicted in FIG. 1A) as the precision battery energy measuring system 200. FIG. 2 outlines an exemplary implementation in accordance with various embodiment designs. In the depicted embodiment, the battery voltage signal 201 is converted to a pulse density function (PDF), as the serial digital stream 213 using digital sigma delta modulator 203 and voltage reference 212. In the illustrated embodiment, the signal processing block 204 processes sensed current signal 202 to condition the sensed current signal 202 to be multiplied with the pulse stream 213 by the multiply function 205. In the illustrated embodiment, the multiply function 205 product of voltage and current is integrated by the precision integrator block 206. In the depicted embodiment, the precision integrator 206 is a switch capacitor integrator. In some embodiments, the precision integrator 206 may be a switch capacitor integrator with double correlated sampling. In the illustrated embodiment, the output of the precision integrator 206 goes up to voltage reference 212, emits a pulse output, resets itself to zero value, and starts another integration cycle. In the depicted embodiment, the precision integrator 206 output pulses are counted as quantum of energy in the quanta counter 207. In the illustrated embodiment, quanta counting is performed for a fixed period to measure energy in or out of the battery during that fixed period. In the illustrated embodiment, the quanta counter 207 output is loaded in the memory 209 with load signal 210. In the depicted embodiment, after load to memory, the quanta counter 207 is reset to zero by reset signal 208. In the illustrated example, the memory block 209 is communicatively and operably coupled to the digital interface with the digital signal processor and controller 211.

Figure 3:
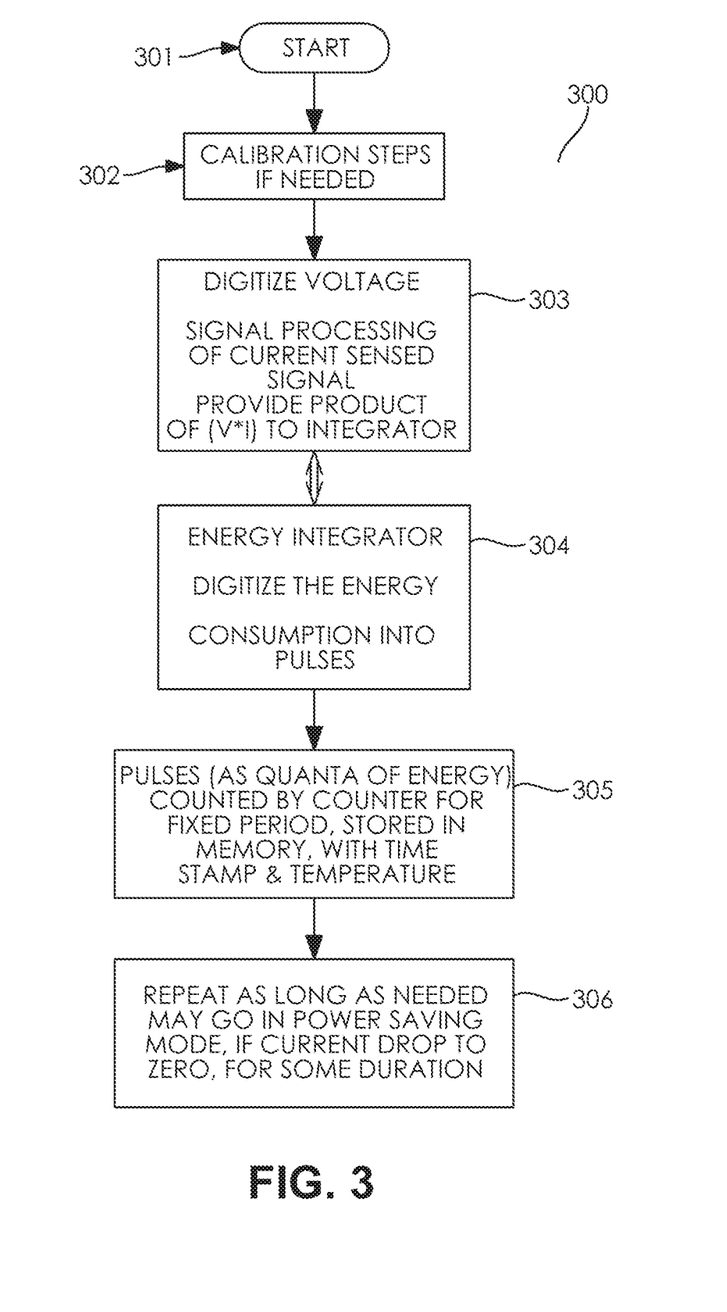
FIG. 3 depicts an exemplary signal flow illustrative of various embodiments of the system depicted by FIG. 1A and FIG. 2.

FIG. 3 depicts an exemplary signal flow illustrative of various embodiments of the system depicted by FIGS. 1A-1C and FIG. 2. FIG. 3 illustrates an exemplary information flow arrangement 300 illustrative of various embodiments. System starts on power on 301. The next block 302, is calibration block that may be used first time when calibration of the system is done. Calibration is done using precision current source, precision voltage source and precision timing. The next block is 303, that process the sensed voltage and it digitize it. The same block also includes signal processing of the sensed current and arrangement to do the product of the voltage and current. The processed signal is fed to an energy integrating circuitry, 304 that produces pulses equal to quanta of the energy measured. The counted pulses are further processed by block 305. In various implementations, data could be time stamped along with ambient digital temperature. The signal processing is repeated from block 303, 304, 305 if it is needed. However, in some embodiments, circuitry may go to power saving mode if the current drops to zero or negligible, as shown in block 306.

Although various embodiments have been described with reference to the Figures, other embodiments are possible. For example, the following table presents exemplary calculation of energy measurement and quantum value. In the example presented, the precision of measurement is 0.0018% of total battery energy. Such precision may typically be obtained in a state of art battery testing lab. In various embodiments, the precision of measurement may be any useful percentage. In some examples, use of such embodiments will take the laboratory level technology to the actual field measurement of the battery voltage levels and state of charge of the battery. In an illustrative example, various precision measurement embodiments may lead to better control on the state of the charge of the battery which will be suitable to the battery chemistry for longer life of battery in the field as well as on the shelf of the vendors.

| | | |
|---|---|---|
| Current sense resistor | 2.00E−02 | ohms |
| Battery voltage, average Vbat | 3.8 | volts |
| Battery capacity, average | 2000 | mA_hour |
| Battery capacity, average | 7600 | mW_hour |
| Battery capacity, average in Second | 27360 | W_sec. |
| Charging current, Ibat | 0.5 | Amp |
| Current sense voltage, Vcs | 0.01 | volts |
| Power (VbatXIbat) | 1.9 | watts |
| Product Vbat & Vcs | 0.038 | |
| Sampling Product every 10uS | | |
| Integrating it on a Cap to 1 V | | |
| Time to do this integration, T_intg | 0.263157895 | mS |
| Energy transfer T_intg | 0.5 | W-Sec |
| Number of T_intg in one hour | 13680 | cycles |
| Number of hours for full capacity | 4 | hours |
| Number of T_intg in full capacity | 54720 | cycles |
| So, number of integrate cycles for 1000 mW-hr | 7200 | cycles |
| So, number of integrate cycles for 7600 mW-hr | 54720 | cycles |
| The unit of energy for calculation is in % of total energy | 0.0018% | |

In various embodiment implementations, a precision battery energy measuring system may include a system with a type C power delivery system for battery charging control; and, another system that has capability of precision monitoring of important parameters such as battery voltages, current going in and out of the battery, meters for charge going in and out of the battery, battery temperature, charging and load detection circuitry along with additional memory.

In some designs, an embodiment precision battery energy measuring system may include a control unit, in which the control unit is operable for communicating with a second device via a default path through the battery, said first device, and via a backup path through other means including wireless or other medium, and said first device, if an undesirable condition occurs in said default path.

In some embodiments, signal transmission in the system may include status information gathered as important parameters during any desired time duration for the battery pack.

In various implementations, an embodiment precision battery energy measuring system may reuse additional memory based on the instructions of an original manufacturer or concerned party about the battery.

In various designs, an embodiment precision battery energy measuring system may include a special power off mode used while the battery is in idle state.

In some embodiments, a precision battery energy measuring system may include a temperature sensor that can measure temperature during charging, idle and load conditions.

Some design embodiments may include battery pack balancing means.

Various embodiment implementations may include weak or defective battery cell identification means.

In an illustrative example, some embodiment designs may be employed for better state of charge of the battery for efficient use of the battery chemistry and technology.

In the Summary above and in this Detailed Description, and the Claims below, and in the accompanying drawings, reference is made to particular features of various embodiments of the invention. It is to be understood that the disclosure of embodiments of the invention in this specification includes all possible combinations of such particular features. For example, where a particular feature is disclosed in the context of a particular aspect or embodiment of the invention, or a particular claim, that feature can also be used—to the extent possible—in combination with and/or in the context of other particular aspects and embodiments of the invention, and in the invention generally.

While multiple embodiments are disclosed, still other embodiments of the present invention will become apparent to those skilled in the art from this detailed description. The invention is capable of myriad modifications in various obvious aspects, all without departing from the spirit and scope of the present invention. Accordingly, the drawings and descriptions are to be regarded as illustrative in nature and not restrictive.

It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments.

In the present disclosure, various features may be described as being optional, for example, through the use of the verb "may;", or, through the use of any of the phrases: "in some embodiments," "in some implementations," "in some designs," "in various embodiments," "in various implementations,", "in various designs," "in an illustrative example," or "for example;" or, through the use of parentheses. For the sake of brevity and legibility, the present disclosure does not explicitly recite each and every permutation that may be obtained by choosing from the set of optional features. However, the present disclosure is to be interpreted as explicitly disclosing all such permutations. For example, a system described as having three optional features may be embodied in seven different ways, namely with just one of the three possible features, with any two of the three possible features or with all three of the three possible features.

In various embodiments. elements described herein as coupled or connected may have an effectual relationship realizable by a direct connection or indirectly with one or more other intervening elements.

In the present disclosure, the term "any" may be understood as designating any number of the respective elements, i.e. as designating one, at least one, at least two, each or all of the respective elements. Similarly, the term "any" may be understood as designating any collection(s) of the respective elements, i.e. as designating one or more collections of the respective elements, a collection comprising one, at least one, at least two, each or all of the respective elements. The respective collections need not comprise the same number of elements.

While various embodiments of the present invention have been disclosed and described in detail herein, it will be apparent to those skilled in the art that various changes may be made to the configuration, operation and form of the invention without departing from the spirit and scope thereof. In particular, it is noted that the respective features of embodiments of the invention, even those disclosed solely in combination with other features of embodiments of the invention, may be combined in any configuration excepting those readily apparent to the person skilled in the art as nonsensical. Likewise, use of the singular and plural is solely for the sake of illustration and is not to be interpreted as limiting.

In the present disclosure, all embodiments where "comprising" is used may have as alternatives "consisting essentially of," or "consisting of" In the present disclosure, any method or apparatus embodiment may be devoid of one or more process steps or components. In the present disclosure, embodiments employing negative limitations are expressly disclosed and considered a part of this disclosure.

Certain terminology and derivations thereof may be used in the present disclosure for convenience in reference only and will not be limiting. For example, words such as "upward," "downward," "left," and "right" would refer to directions in the drawings to which reference is made unless otherwise stated. Similarly, words such as "inward" and "outward" would refer to directions toward and away from, respectively, the geometric center of a device or area and designated parts thereof. References in the singular tense include the plural, and vice versa, unless otherwise noted.

The term "comprises" and grammatical equivalents thereof are used herein to mean that other components, ingredients, steps, among others, are optionally present. For example, an embodiment "comprising" (or "which comprises") components A, B and C can consist of (i.e., contain only) components A, B and C, or can contain not only components A, B, and C but also contain one or more other components.

Where reference is made herein to a method comprising two or more defined steps, the defined steps can be carried out in any order or simultaneously (except where the context excludes that possibility), and the method can include one or more other steps which are carried out before any of the defined steps, between two of the defined steps, or after all the defined steps (except where the context excludes that possibility).

The term "at least" followed by a number is used herein to denote the start of a range beginning with that number (which may be a range having an upper limit or no upper limit, depending on the variable being defined). For example, "at least 1" means 1 or more than 1. The term "at most" followed by a number (which may be a range having 1 or 0 as its lower limit, or a range having no lower limit, depending upon the variable being defined). For example, "at most 4" means 4 or less than 4, and "at most 40%" means 40% or less than 40%. When, in this specification, a range is given as "(a first number) to (a second number)" or "(a first number)–(a second number)," this means a range whose limit is the second number. For example, 25 to 100 mm means a range whose lower limit is 25 mm and upper limit is 100 mm.

Many suitable methods and corresponding materials to make each of the individual parts of embodiment apparatus are known in the art. According to an embodiment of the present invention, one or more of the parts may be formed by machining, 3D printing (also known as "additive" manufacturing), CNC machined parts (also known as "subtractive" manufacturing), and injection molding, as will be apparent to a person of ordinary skill in the art. Metals, wood, thermoplastic and thermosetting polymers, resins and elastomers as may be described herein-above may be used. Many suitable materials are known and available and can be selected and mixed depending on desired strength and flexibility, preferred manufacturing method and particular use, as will be apparent to a person of ordinary skill in the art.

Any element in a claim herein that does not explicitly state "means for" performing a specified function, or "step for" performing a specific function, is not to be interpreted as a "means" or "step" clause as specified in 35 U.S.C. § 112 (f). Specifically, any use of "step of" in the claims herein is not intended to invoke the provisions of 35 U.S.C. § 112 (f).

According to an embodiment of the present invention, the system and method may be accomplished through the use of one or more computing devices. As depicted, for example, in various illustrative examples herein, one of ordinary skill in the art would appreciate that an exemplary system appropriate for use with embodiments in accordance with the present application may generally include one or more of a Central processing Unit (CPU), Random Access Memory (RAM), a storage medium (e.g., hard disk drive, solid state drive, flash memory, cloud storage), an operating system (OS), one or more application software, a display element, one or more communications means, or one or more input/output devices/means. Examples of computing devices usable with embodiments of the present invention include, but are not limited to, proprietary computing devices, personal computers, mobile computing devices, tablet PCs, mini-PCs, servers or any combination thereof. The term computing device may also describe two or more computing devices communicatively linked in a manner as to distribute and share one or more resources, such as clustered computing devices and server banks/farms. One of ordinary skill in the art would understand that any number of computing devices could be used, and embodiments of the present invention are contemplated for use with any computing device.

In various embodiments, communications means, data store(s), processor(s), or memory may interact with other components on the computing device, in order to effect the provisioning and display of various functionalities associated with the system and method detailed herein. One of ordinary skill in the art would appreciate that there are numerous configurations that could be utilized with embodiments of the present invention, and embodiments of the present invention are contemplated for use with any appropriate configuration.

According to an embodiment of the present invention, the communications means of the system may be, for instance, any means for communicating data over one or more networks or to one or more peripheral devices attached to the system. Appropriate communications means may include, but are not limited to, circuitry and control systems for providing wireless connections, wired connections, cellular connections, data port connections, Bluetooth connections, or any combination thereof. One of ordinary skill in the art would appreciate that there are numerous communications means that may be utilized with embodiments of the present invention, and embodiments of the present invention are contemplated for use with any communications means.

Throughout this disclosure and elsewhere, block diagrams and flowchart illustrations depict methods, apparatuses (i.e., systems), and computer program products. Each element of the block diagrams and flowchart illustrations, as well as each respective combination of elements in the block diagrams and flowchart illustrations, illustrates a function of the methods, apparatuses, and computer program products. Any and all such functions ("depicted functions") can be implemented by computer program instructions; by special-purpose, hardware-based computer systems; by combinations of special purpose hardware and computer instructions; by combinations of general purpose hardware and computer instructions; and so on—any and all of which may be generally referred to herein as a "circuit," "module," or "system."

While the foregoing drawings and description may set forth functional aspects of the disclosed systems, no particular arrangement of software for implementing these functional aspects should be inferred from these descriptions unless explicitly stated or otherwise clear from the context.

Each element in flowchart illustrations may depict a step, or group of steps, of a computer-implemented method. Further, each step may contain one or more sub-steps. For the purpose of illustration, these steps (as well as any and all other steps identified and described above) are presented in order. It will be understood that an embodiment can contain an alternate order of the steps adapted to a particular application of a technique disclosed herein. All such variations and modifications are intended to fall within the scope of this disclosure. The depiction and description of steps in any particular order is not intended to exclude embodiments having the steps in a different order, unless required by a particular application, explicitly stated, or otherwise clear from the context.

Traditionally, a computer program consists of a sequence of computational instructions or program instructions. It will be appreciated that a programmable apparatus (i.e., computing device) can receive such a computer program and, by processing the computational instructions thereof, produce a further technical effect.

A programmable apparatus may include one or more microprocessors, microcontrollers, embedded microcontrollers, programmable digital signal processors, programmable devices, programmable gate arrays, programmable array logic, memory devices, application specific integrated circuits, or the like, which can be suitably employed or configured to process computer program instructions, execute computer logic, store computer data, and so on. Throughout this disclosure and elsewhere a computer can include any and all suitable combinations of at least one general purpose computer, special-purpose computer, programmable data processing apparatus, processor, processor architecture, and so on.

It will be understood that a computer can include a computer-readable storage medium and that this medium may be internal or external, removable and replaceable, or fixed. It will also be understood that a computer can include a Basic Input/Output System (BIOS), firmware, an operating system, a database, or the like that can include, interface with, or support the software and hardware described herein.

Embodiments of the system as described herein are not limited to applications involving conventional computer programs or programmable apparatuses that run them. It is contemplated, for example, that embodiments of the invention as claimed herein could include an optical computer, quantum computer, analog computer, or the like.

Regardless of the type of computer program or computer involved, a computer program can be loaded onto a computer to produce a particular machine that can perform any and all of the depicted functions. This particular machine provides a means for carrying out any and all of the depicted functions.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Computer program instructions can be stored in a computer-readable memory capable of directing a computer or other programmable data processing apparatus to function in a particular manner. The instructions stored in the computer-readable memory constitute an article of manufacture including computer-readable instructions for implementing any and all of the depicted functions.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

The elements depicted in flowchart illustrations and block diagrams throughout the figures imply logical boundaries between the elements. However, according to software or hardware engineering practices, the depicted elements and the functions thereof may be implemented as parts of a monolithic software structure, as standalone software modules, or as modules that employ external routines, code, services, and so forth, or any combination of these. All such implementations are within the scope of the present disclosure.

Unless explicitly stated or otherwise clear from the context, the verbs "execute" and "process" are used interchangeably to indicate execute, process, interpret, compile, assemble, link, load, any and all combinations of the foregoing, or the like. Therefore, embodiments that execute or process computer program instructions, computer-executable code, or the like can suitably act upon the instructions or code in any and all of the ways just described.

The functions and operations presented herein are not inherently related to any particular computer or other apparatus. Various general-purpose systems may also be used with programs in accordance with the teachings herein, or it may prove convenient to construct more specialized apparatus to perform the required method steps. The required structure for a variety of these systems will be apparent to those of skill in the art, along with equivalent variations. In addition, embodiments of the invention are not described with reference to any particular programming language. It is appreciated that a variety of programming languages may be used to implement the present teachings as described herein, and any references to specific languages are provided for disclosure of enablement and best mode of embodiments of the invention. Embodiments of the invention are well suited to a wide variety of computer network systems over numerous topologies. Within this field, the configuration and management of large networks include storage devices and computers that are communicatively coupled to dissimilar computers and storage devices over a network, such as the Internet.

Reference has been made in detail to various embodiments of the present invention. While some embodiments of the invention have been described, it will be understood that possible embodiments of the invention are not limited to embodiments described. On the contrary, embodiments of the present invention are intended to cover alternatives, modifications and equivalents, which may be included within the spirit and scope of the embodiments described.

Some embodiments such as those described herein may be discussed in the general context of computer-executable instructions residing on some form of computer-usable medium, such as program modules, executed by one or more computers or other devices. Generally, program modules include routines, programs, objects, components, data structures, etc., that perform tasks or implement data types. The functionality of the program modules may be combined or distributed as desired in various embodiments.

Some portions of the detailed description herein may be presented in terms of procedures, logic blocks, processing and other symbolic representations of operations on data bits within a computer memory. Some such descriptions and representations are the means used by those skilled in the data processing arts to convey the substance of their work to others skilled in the art. In the present application, some procedures, logic blocks, processes, or the like, may be conceived as self-consistent sequences of steps or instructions leading to a desired result. In some examples, steps may be conceived as those requiring physical manipulations of physical quantities. In some examples, such quantities may take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "determining," "enabling," "detecting" or the like, refer to the actions and processes (e.g., flowchart of FIG. ______) of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data.

Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

Communication media can embody computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

In the detailed description herein, numerous specific details are set forth in order to provide a thorough understanding of embodiments in accordance with the present invention. However, it will be recognized by one of ordinary skill in the art that embodiments of the present invention may be practiced without these specific details. In other instances, well known methods, procedures, components, and circuits have not been described in detail as not to unnecessarily obscure aspects of embodiments of the present invention.

A number of implementations have been described. Nevertheless, it will be understood that various modifications may be made. For example, advantageous results may be achieved if the steps of the disclosed techniques were performed in a different sequence, or if components of the disclosed systems were combined in a different manner, or if the components were supplemented with other components. Accordingly, other implementations are contemplated within the scope of the following claims.

What is claimed is:

1. A process, comprising:
   a method to measure the energy of a battery, comprising:
      determining the battery energy based on multiplying the battery current and the digitized battery voltage;
      converting the battery energy to a series of pulses proportional to the energy in or out of the battery; and,
      measuring a battery energy parameter based on counting the pulses.

2. The process of claim 1, in which each pulse of the series of pulses is proportional to a precision small energy unit.

3. The process of claim 2, in which the precision small energy unit is predetermined as a percentage of the battery energy capacity.

4. The process of claim 1, in which the digitized battery voltage further comprises a pulse frequency modulated signal.

5. The process of claim 1, in which converting the battery energy to a series of pulses further comprises integrating the product of the multiplied battery current and the digitized battery voltage.

6. The process of claim 1, in which the process further comprises monitoring the sign of the current sense indicating the energy in or out of the battery.

7. The process of claim 1, in which the process further comprises measuring a battery energy parameter determined as a function of measured battery temperature.

8. The process of claim 1, in which the process further comprises transferring a measured battery energy parameter to a battery manufacturer via a communication interface selected from the group USB type C, and wireless.

9. A machine, comprising:
a precision battery energy measuring apparatus, comprising:
an analog to digital converter, having an input, and an output, wherein the analog to digital converter is configured to emit at the analog to digital converter output the digitized voltage of a battery operably connected to the analog to digital converter input;
a multiplier, having a first input, a second input, and an output, wherein the multiplier first input is operably connected to the analog to digital converter output, and wherein the multiplier second input is operably configured to receive sensed battery current applied to the multiplier second input, and wherein the multiplier is configured to provide at the multiplier output the product of the digitized voltage and the sensed battery current;
an integrator, having an input, and an output, wherein the integrator input is connected to the multiplier output, and wherein the integrator is configured to integrate as a function of time the product of the digitized voltage and the sensed battery current, and to emit at the integrator output a series of pulses proportional to the energy in or out of the battery; and,
a counter, having an input, and an output, wherein the counter input is operably connected to the integrator output, and wherein the counter is configured to accumulate a count of the series of pulses applied to the counter input.

10. The machine of claim 9, in which the analog to digital converter is configured to emit at the analog to digital converter output digitized voltage further comprising a pulse frequency modulated signal.

11. The machine of claim 9, in which the machine further comprises a current sense monitoring circuit, having an input, and an output, wherein the current sense monitoring circuit input is operably coupled with the multiplier output, and wherein the current sense monitoring circuit is configured to emit on the current sense monitoring circuit output the sign of the current sense indicating energy going in or out of the battery, wherein the current sense monitoring circuit output is operably coupled with the integrator input, and wherein the integrator is configured to emit the series of pulses proportional to the energy in or out of the battery determined as a function of the sign of the current sense emitted by the current sense monitoring circuit output.

12. The machine of claim 9, in which the machine further comprises a first memory operably coupled with the counter output to retrievably store the accumulated count of the series of pulses applied to the counter input.

13. The machine of claim 12, in which the machine further comprises:
a controller, comprising:
a processor, operably and communicatively coupled with the integrator, the counter, and the first memory;
a second memory that is not a transitory propagating signal, the second memory operably connected to the processor and encoding computer readable instructions, including processor executable program instructions, the computer readable instructions accessible to the processor, wherein the processor executable instructions, when executed by the processor, cause the processor to perform operations comprising:
reading, from the first memory, the accumulated count of the series of pulses applied to the counter input; and,
calculating a battery energy parameter determined as a function of the count of the series of pulses.

14. The machine of claim 13, in which the machine further comprises a wireless data interface operably coupled with the controller, and wherein the operations performed by the processor further comprise transferring the calculated battery energy parameter via the wireless data interface.

15. A machine, comprising:
a precision battery energy measuring apparatus, comprising:
an analog to digital converter, having an input, and an output, wherein the analog to digital converter is configured to emit at the analog to digital converter output the digitized voltage of a battery operably connected to the analog to digital converter input;
a multiplier, having a first input, a second input, and an output, wherein the multiplier first input is operably connected to the analog to digital converter output, and wherein the multiplier second input is operably configured to receive sensed battery current applied to the multiplier second input, and wherein the multiplier is configured to provide at the multiplier output the product of the digitized voltage and the sensed battery current;
an integrator, having a signal input, and an output, wherein the integrator signal input is connected to the multiplier output, wherein the integrator is configured to integrate as a function of time the product of the digitized voltage and the sensed battery current and to emit at the integrator output a series of pulses proportional to the energy in or out of the battery, wherein the integrator is configured with a reset input, and wherein the integrator is configured to reset the integrator output to a predetermined reference value when a reset signal is applied to the integrator reset input;
a counter, having an input, and an output, wherein the counter input is operably connected to the integrator output, wherein the counter is configured to accumulate a count of the series of pulses applied to the counter input, and wherein the counter is configured with a reset input, and wherein the counter is configured to reset the accumulated count to a predetermined reference value when a reset signal is applied to the counter reset input;
a first memory, operably coupled with the counter output to retrievably store the accumulated count of the series of pulses applied to the counter input;
a temperature sensor, configured to transduce to digital form the temperature of a battery cell operably coupled with the temperature;
a first wireless data interface, operably coupled with the first memory;
a second wireless data interface, operably coupled with the first memory, wherein the second wireless data interface is separate and distinct from the first wireless data interface; and,
a controller, comprising:
a processor, operably and communicatively coupled with the integrator, the counter, the temperature sensor, the first memory, the first wireless data interface, and the second wireless data interface;
a second memory that is not a transitory propagating signal, the second memory operably connected to the processor and encoding computer readable instructions, including processor executable program instructions, the computer readable instructions accessible to the processor, wherein the processor executable instructions, when executed by the processor, cause the processor to perform operations comprising:

reading, from the first memory, the accumulated count of the series of pulses applied to the counter input;

calculating a first battery energy parameter determined as a function of the count of the series of pulses;

storing, in the first memory, the first battery energy parameter;

reading, from the temperature sensor, the temperature of a battery cell;

calculating a second battery energy parameter determined as a function of the temperature of a battery cell;

storing, in the first memory, the second battery energy parameter;

resetting the counter;

determining if the first wireless data interface is operational;

upon a determination the first wireless data interface is operational, transferring the calculated battery energy parameter via the first wireless data interface; and, upon a determination the first wireless data interface is not operational, transferring the calculated battery energy parameter via the second wireless data interface.

16. The machine of claim 15, in which the integrator further comprises a switched capacitor integrator.

17. The machine of claim 15, in which the integrator further comprises double correlated sampling.

18. The machine of claim 15, in which the analog to digital converter further comprises a digital sigma delta modulator.

19. The machine of claim 15, in which the battery includes more than one cell.

20. The machine of claim 15, in which the calculated battery energy parameter further comprises at least one of: battery voltage; battery charging current; battery discharging current; energy stored during battery charging; energy delivered out of the battery during use; battery temperature; or, temperature of one or more cell of a multi-cell battery.

* * * * *